United States Patent
Cali' et al.

[19]

[11] Patent Number: 6,093,981

[45] Date of Patent: Jul. 25, 2000

[54] SWITCHING OF A CAPACITOR ON A MUTUALLY EXCLUSIVE SELECTED ONE OF A PLURALITY OF INTEGRATED AMPLIFIERS

[75] Inventors: Giovanni Cali', Catania; Angelo Granata, Syracuse; Giuseppe Palmisano, Catania, all of Italy

[73] Assignee: STMicroelectronics S.r.l., Agrate Brianza, Italy

[21] Appl. No.: 09/251,689

[22] Filed: Feb. 17, 1999

[30] Foreign Application Priority Data

Feb. 19, 1998 [EP] European Pat. Off. .............. 98830077

[51] Int. Cl.$^7$ ...................................................... H03F 3/195
[52] U.S. Cl. ............................ 307/113; 307/115; 330/51; 330/124 R
[58] Field of Search ........................ 330/51, 295, 124 R, 330/124 D, 277, 278, 307; 307/113, 115; 327/358, 545

[56] References Cited

U.S. PATENT DOCUMENTS

| | | | |
|---|---|---|---|
| 3,798,468 | 3/1974 | Elshuber | 307/242 |
| 4,598,252 | 7/1986 | Andricos | 330/51 |
| 4,670,720 | 6/1987 | Dijkmans | 330/51 |
| 5,148,121 | 9/1992 | Uchida | 330/295 |
| 5,604,460 | 2/1997 | Sehrig et al. | 330/51 |
| 5,608,348 | 3/1997 | Kearney et al. | 327/538 |
| 5,834,975 | 11/1998 | Bartlett et al. | 330/278 |
| 5,861,776 | 1/1999 | Swanson | 330/124 R |
| 5,872,481 | 2/1999 | Sevic et al. | 330/51 |
| 5,912,582 | 6/1999 | Pisati et al. | 327/551 |
| 5,929,709 | 7/1999 | Eriksson et al. | 330/298 |
| 5,986,500 | 11/1999 | Park et al. | 330/124 D |

FOREIGN PATENT DOCUMENTS 0 695 106 A1  7/1994  European Pat. Off. .......... H04R 3/00

*Primary Examiner*—Jeffrey Gaffin
*Assistant Examiner*—Rios Roberto
*Attorney, Agent, or Firm*—Theodore E. Galanthay; Allen, Dyer, Doppelt, Milbrath & Gilchrist, P.A.

[57] ABSTRACT

A circuit switches a capacitive value in an exclusive manner to a selected integrated amplifier among a plurality of integrated amplifiers. The circuit includes a first current generator connected between a first supply node and a first node of the circuit, and a second current generator connected between a second supply node and a second node of the circuit. The second current generator is electrically in parallel with the capacitor. An array of switches equal in number to the integrated amplifiers are exclusively switched ON for connecting a directly biased diode between the first node and the second node. Each integrated amplifier has a supply node coupled to a connecting node between a respective diode and a respective connecting switch of the array of switches.

17 Claims, 3 Drawing Sheets

SWITCHING OF A CAPACITOR ON A MUTUALLY EXCLUSIVE SELECTED ONE OF A PLURALITY OF INTEGRATED AMPLIFIERS

FIELD OF THE INVENTION

The present invention relates to the field of integrated circuits, and, more particularly, to a switching circuit for exclusively providing an electrical path to a selected circuit among a plurality of circuits.

BACKGROUND OF THE INVENTION

In many applications, it is often necessary to duplicate several times the same radio frequency (RF) circuit or functional block. Each duplicated circuit is designed with a different electrical characteristic to optimize performance in a limited range of radio signal frequencies. The circuit or functional block that is the most adequate to the current operating conditions is automatically selected by closing and opening switches and/or commanding path selectors that choose one path among several available paths.

A general application of such a switching scheme may be described by referring to FIG. 1. This figure shows N amplifiers A1–AN, and N groups of three switches SA1–SAN, SB1–SBN, SC1–SCN. Each group of switches is associated to a respective amplifier A1–AN. Each of the N amplifiers and the groups of switches can be connected to a capacitor C. The switches function as selectors for exclusively connecting one of the N amplifiers to the capacitor C.

For example, the amplifier A1 is selected through the SA1, SB1 switches and the capacitor C is coupled to the selected amplifier A1 through the SC1 switch. The scheme of FIG. 1 is applicable when the alternately operating N amplifiers require large valued capacitors for their correct functioning. Large valued capacitors may be needed to provide a high level of stability to the N feedback amplifiers, and to reduce the pass band for lowering the noise power. In these cases, the most immediate approach of using a capacitor for each amplifier would require a large silicon surface area for integrating all the capacitors. Alternatively, N external capacitors would be used if integrating the capacitors was too costly and/or not practical. This latter approach requires N dedicated pins.

The scheme of FIG. 1 represents the known approach of using a single capacitor that is selectively switched by closing one of the SC1–SCN switches to one of the amplifiers A1–AN, that is then selected through the respective SA1–SAN and SB1–SBN switches. The capacitor C may be integrated if convenient, or may be an external capacitor requiring only one dedicated pin. The use of external capacitors results in a cost reduction.

The scheme of FIG. 1 may be formed by using an alternative technique for selecting the amplifiers, instead of using the respective SA1–SAN and SB1–SBN switches. These techniques include leaving in an ON state the selected amplifier and switching OFF all the deselected amplifiers by controlling the bias current of the amplifiers. This approach is preferable under many conditions.

The circuit of FIG. 1 may be readily implemented in a CMOS technology due to the availability of analog switches that provide excellent performance with MOS transistors. In contrast, there may be several problems using bipolar technology. These problems are due to the use of analog switches formed with bipolar transistors operating between the cutoff and saturation regions.

A switch made with a bipolar junction transistor requires a relatively large base current to turn on the switch, and thus implies relatively long switching times. The main problem is due to the fact that a bipolar junction transistor may trigger parasitic transistors when dynamically switched between the cutoff and the saturation regions. This may negatively affect the functioning of the integrated circuit.

SUMMARY OF THE INVENTION

An object of the invention is to provide a circuit implementation of the basic scheme illustrated in FIG. 1 that is effective even when using bipolar technology. The circuit of the invention effectively overcomes the problem of forming the SC1–SCN switches by not forming these switches with saturated bipolar junction transistors that are likely to induce spurious currents when switched ON. Spurious currents may generate undesired offset effects.

For the selection of one amplifier among the plurality of amplifiers, an alternative technique of leaving in an ON state the selected amplifier and switching-off the other amplifiers is used. This alternate technique does not require the use of a pair of switches, such as SA1 and SB1.

The circuit of the invention is for coupling a capacitor on a supply node to an exclusively selected integrated amplifier among a plurality of integrated amplifiers. The circuit comprises a first current generator connected between a first supply node VCC and a first node of the circuit. A second current generator is connected between a second supply node GND and a second node of the circuit, which is electrically in parallel to the capacitor to be coupled to the selected integrated amplifier. An array of switches identical in number to the integrated amplifiers are selectively and exclusively switched ON. Each switch connects a directly biased diode between the two nodes of the circuit. Each integrated amplifier has its own supply node coupled to the connection node between a respective diode and a respective array of switches.

DETAILED DESCRIPTION OF THE PREFERRED EMBODIMENTS

A practical application of the circuit of the invention is for coupling a resistive load to an exclusively selected error amplifier among a plurality of error amplifiers. The circuit of the invention is described purely for illustration purposes, and is used for controlling the amplitude of the oscillations in a voltage mode LC oscillator (VCO) used in radio frequency (RF) integrated circuits. These oscillators use a variable capacitor in the resonating LC network, which is implemented in the form of an inversely biased PN junction diode. These diodes are typically a standard base-emitter or base-collector junction. Due to the relatively low voltage of operation, these diodes exhibit a junction capacity having a small spread, which limits the regulation range of the VCO frequency.

An approach to the problem of covering a frequency range sufficiently ample for radio frequency applications is to use several oscillators. Accordingly, several error amplifiers are used which are selectable according to performance requirements. Notably, the error amplifier significantly contributes to the phase noise of the VCO, especially when the latter operates with large amplitudes of oscillation. The nonlinear behavior of the VCO modulates the low frequency noise of the error amplifier and shifts it to high frequencies. This superimposes the noise onto the intrinsic noise produced by the oscillator itself.

Figure 1:
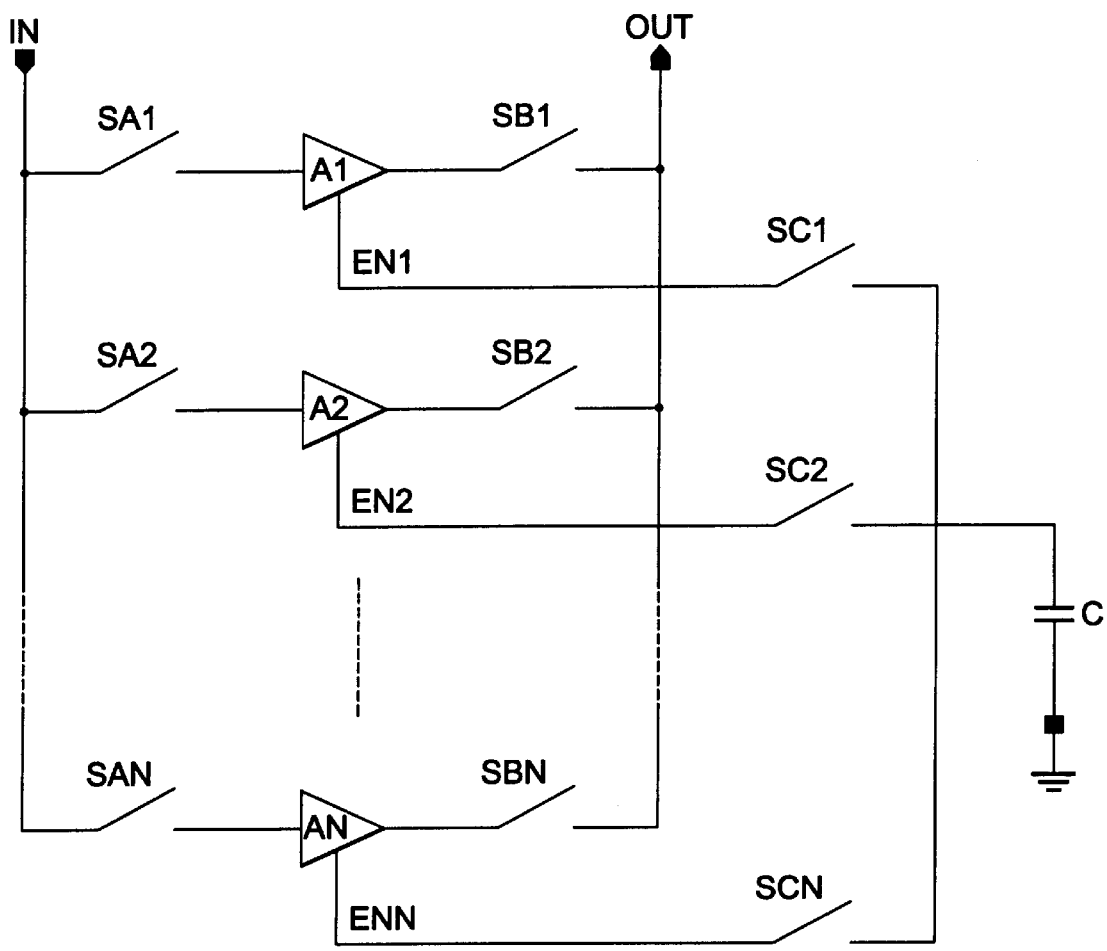
FIG. 1 depicts a selection scheme for selecting an amplifier and for switching the only capacitor C on the supply node of the selected amplifier, according to the prior art.

To reduce the low noise frequency component of the error amplifier, it is necessary to use large filtering capacitors. Because it is also necessary to ensure a low phase noise, typically within a few tens of kilohertz, filtering capacitors of large capacitance are usually externally connected to the integrated circuit. Therefore, the problem is to find a circuit for implementing the basic scheme of FIG. 1 without triggering parasitic transistors and/or cause offset phenomena. This is in addition to the filtering specifications requiring a unique capacitor using only one dedicated pin.

Figure 2:
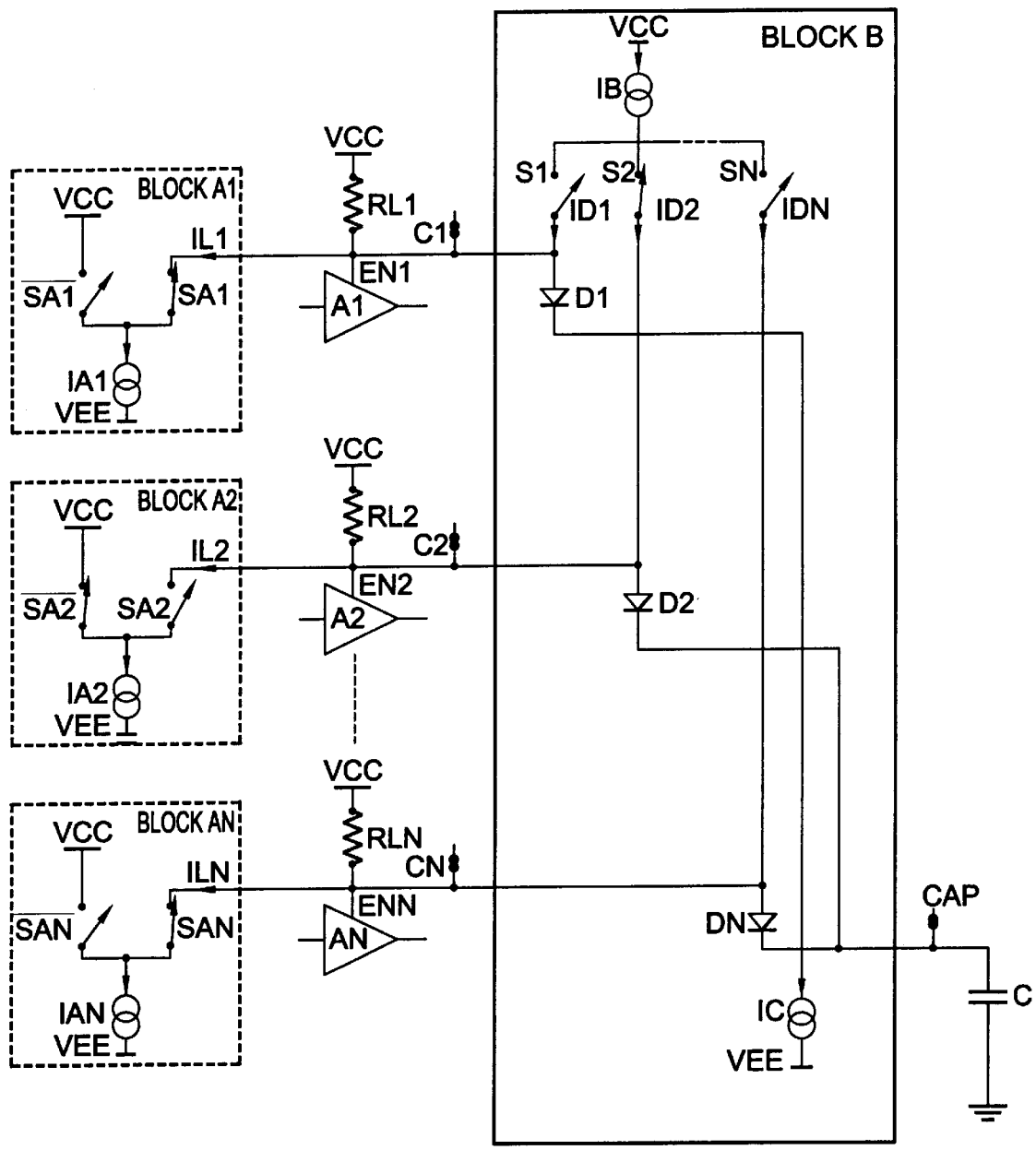
FIG. 2 is a basic scheme of the circuit, according to the present invention.

By referring to the scheme of the invention shown in FIG. 2, the capacitor C is effectively switched to the different amplifiers A1–AN, as described above. The elements A1–AN indicate the N error amplifiers on a supply node of which the capacitor C must be switched. The RL1–RLN resistors represent respective load elements. The sections indicated as blocks A1–AN represent the on/off selector switches which cause the selection of the amplifiers A1–AN. Another array of switches, not shown in FIG. 2, operate synchronously with the SA1–SAN switches to switch off simultaneously the operating current on the deselected amplifiers.

In the above described scheme, the switching circuit of the capacitor C is represented by the block B. The block B must connect the capacitor C to one of the N amplifiers in the most efficient manner. The circuit selectively activates one of the N diodes D1–DN, bringing it to a condition of direct bias. This creates a low impedance connection path between the selected amplifier and the capacitor. The selection of one of the N diodes may be performed through a decoder establishing in the selected diode an adequate biasing current (IB) provided by the relative current generators IB and IC.

To avoid an undesired offset in the selected amplifier due to a difference between the IB and IC currents, which would reflect itself on a load element, a current gain (b) compensating circuit of the PNP transistors is implemented. This is applicable if a bipolar embodiment of the invention is used. The current gain parameter (b) is the main cause of any offset problem. As a result of the circuit disclosed in detail in the following description, the currents IB and IC are equalized with high precision.

Figure 3:
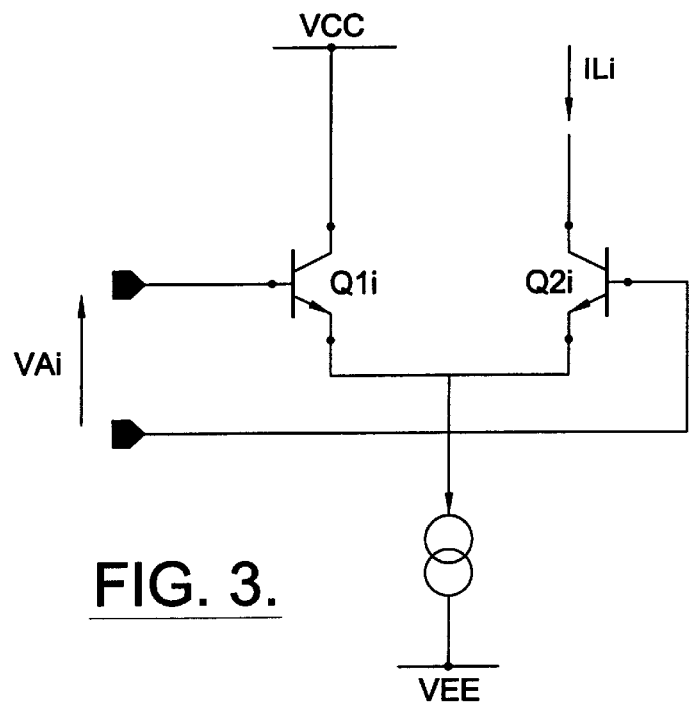
FIG. 3 shows a circuit for selecting one of the plurality of integrated amplifiers, according to the present invention.

The switch S1 of the capacitor C of FIG. 2 is closed simultaneously with the opening of the selection switch SA1 of the integrated amplifier, while all the other switches SA2–SAN are closed for setting to an OFF state all the deselected amplifiers. Closing the S1 switch causes the IB current to flow through the respective diode D1, while the other diodes are left in an OFF state. The circuits that implement the A1–AN blocks and the B block are shown respectively in FIGS. 3 and 4. The circuit of FIG. 3 is a common current selector based on a differential pair of transistors.

Figure 4:
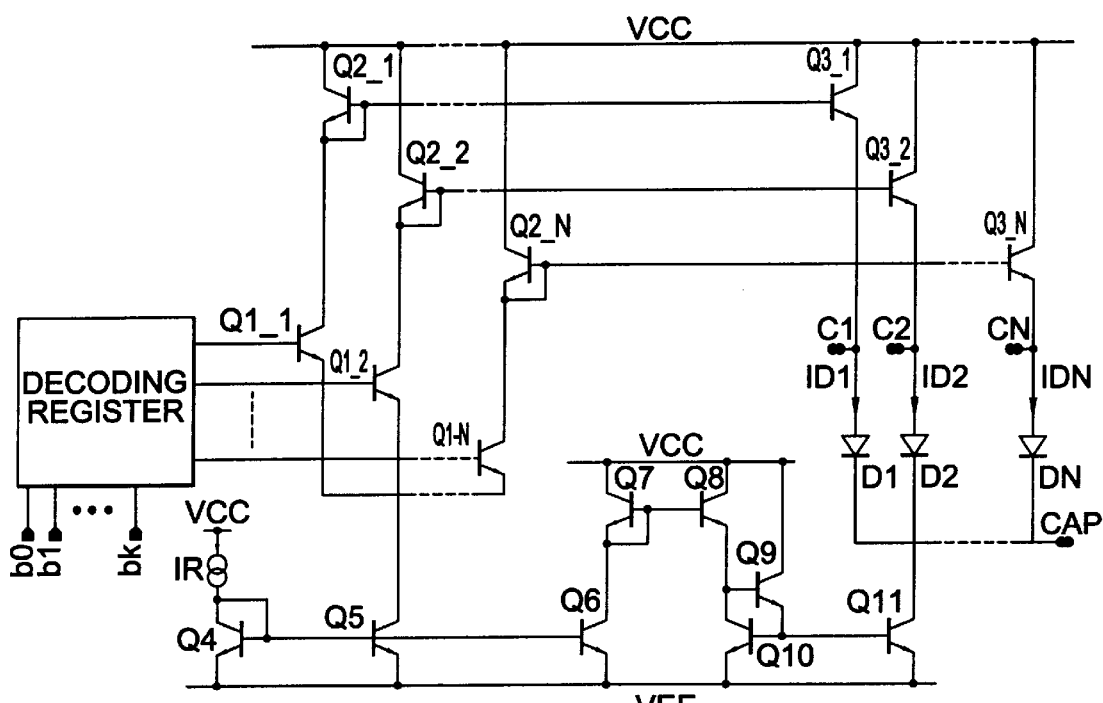
FIG. 4 shows a preferred embodiment of the circuit, according to the present invention.

In the circuit of FIG. 4, the decoder and the transistors Q1_1–Q1_N form the switches S1–SN and their relative control. The current generator IR, the mirror Q4–Q5, and the mirrors formed by the transistors Q2_1–Q2_N and Q3_1–Q3_N form the generator IB. The generator IC is formed by the current generator IR, and the mirrors Q4–Q6, Q7–Q8 and Q10–Q11. The functioning of the circuit is described as follows. A program word, formed by bo-bk bits, switches the current of Q5 to one of the N transistors Q1_i operating as a switch. The current is forced to the selected diode Di through the PNP transistors mirrors Q2_i and Q3_i. To make the current of Q3_i equal to that of Q11 (that is of IC), thereby preventing offset problems as previously mentioned, the current IR, instead of being directly mirrored on Q11, is passed through a PNP current mirror Q7–Q8 and successively mirrored on Q11 by Q9–Q10. In this way, the currents of Q11 and of Q3_i will be substantially equal, except for tolerance errors.

The fact that the capacitance is linked through the dynamic resistance of a directly biased diode involves a slight change in the desired dominant pole model. Consequently, there is a presence of a zero associated with the incremental resistance, rd, of the directly biased diode. The resulting expressions of the dominant pole and of the zero respectively are:

$$f_p = \frac{1}{2\pi * RLi * C}$$

$$f_z = \frac{1}{2\pi * \mathrm{rd} * C}$$

From these equations it may be observed that the IB current, and thus the IC current, should not be set to a value too low because this would imply a zero too close to the pole. Currents of about 50 $\mu$A are in most cases sufficient to provide an adequate separation between the pole and the zero.

What is claimed is:

1. A circuit for switching a capacitive load to a selected one of a plurality of integrated amplifiers, the circuit comprising:

a first current generator connected between a first supply node and a first circuit node;

a second current generator connected between a second supply node and a second circuit node, said second current generator connected in parallel with the capacitive load;

a plurality of directly biased diodes;

a plurality of switches equal in number to the plurality of integrated amplifiers, each switch exclusively switchable for connecting a respective directly biased diode between the first circuit node and the second circuit node; and each integrated amplifier having a supply node coupled to a connecting node between a respective directly biased diode and switch.

2. A circuit according to claim 1, further comprising:

a k+1 decoding register having a plurality of inputs for receiving a k+1 program word, and having a plurality of outputs for controlling said plurality of switches; and said first current generator and said second current generator each further comprising a plurality of current mirrors.

3. A circuit according to claim 1, wherein said plurality of switches comprises a plurality of transistors.

4. A circuit according to claim 3, wherein each of said transistors comprises a bipolar transistor.

5. A circuit according to claim 1, wherein said first and second current generators generate a current greater than about 50 µA.

6. A circuit for switching a capacitive load to a selected one of a plurality of functional circuits, the circuit comprising:
- a first current generator connected between a first supply node and a first circuit node;
- a second current generator connected between a second supply node and a second circuit node, said second current generator connected in parallel with the capacitive load;
- a plurality of diodes;
- a plurality of switches equal in number to the plurality of functional circuits, each switch exclusively switchable for connecting a respective diode between the first circuit node and the second circuit node; and
- each functional circuit having a supply node coupled to a connecting node between a respective diode and switch.

7. A circuit according to claim 6, wherein each of said diodes comprises a directly biased diode.

8. A circuit according to claim 6, further comprising:
- a k+1 decoding register having a plurality of inputs for receiving a k+1 program word, and having a plurality of outputs for controlling said plurality of switches; and
- said first current generator and said second current generator each further comprising a plurality of current mirrors.

9. A circuit according to claim 6, wherein said plurality of switches comprises an plurality of transistors.

10. A circuit according to claim 9, wherein each of said transistors comprises a bipolar transistor.

11. A circuit according to claim 8, wherein said first and second current generators generate a current greater than about 50 µA.

12. A method for switching a capacitive load to a selected one of a plurality of functional circuits, the method comprising the steps of:
- connecting a first current generator between a first supply node and a first circuit node;
- connecting a second current generator between a second supply node and a second circuit node, the second current generator being connected in parallel with the capacitive load;
- directly biasing diodes between the first circuit node and the second circuit node; and
- using a plurality of switches for exclusively connecting a respective directly biased diode between the first circuit node and the second circuit node; each functional circuit having a supply node connected to a node between a respective directly biased diode and switch.

13. A method according to claim 12, wherein the step of using a plurality of switches further comprises receiving a k+1 program word at an input of a k+1 decoding register having a plurality of inputs and having a plurality of outputs for controlling the plurality of switches.

14. A method according to claim 12, wherein the plurality of switches comprises an plurality of transistors.

15. A method according to claim 14, wherein each of the transistors comprises a bipolar transistor.

16. A method according to claim 12, wherein the first and second current generators generate a current greater than about 50 µA.

17. A method according to claim 12, wherein the first and second current generators each comprises a plurality of current mirrors.

* * * * *